(12) United States Patent
Mitamura

(10) Patent No.: US 6,475,923 B1
(45) Date of Patent: Nov. 5, 2002

(54) GROUP III NITRIDE COMPOUND SEMICONDUCTOR THIN FILM AND DEPOSITION METHOD THEREOF, AND SEMICONDUCTOR DEVICE AND MANUFACTURING METHOD THEREOF

(75) Inventor: Satoshi Mitamura, Saitama (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/616,688

(22) Filed: Jul. 14, 2000

(30) Foreign Application Priority Data

Jul. 19, 1999 (JP) .......................................... 11-205216

(51) Int. Cl.[7] .............................................. H01L 21/31
(52) U.S. Cl. ...................................................... 438/758
(58) Field of Search ................................ 438/478, 308, 438/166, 151, 788; 117/92

(56) References Cited

U.S. PATENT DOCUMENTS 6,265,287 B1 * 7/2001 Tsujimura et al. .......... 438/478
6,271,066 B1 * 8/2001 Yamazaki et al. .......... 438/166

* cited by examiner

*Primary Examiner*—David Nelms
*Assistant Examiner*—ReneéR Berry
(74) *Attorney, Agent, or Firm*—Sonnenschein, Nath & Rosenthal

(57) ABSTRACT

A Group III nitride compound semiconductor thin film which can be deposited on any given substrate to have uniform film quality and excellent crystalline, and a deposition method thereof. A semiconductor device and a manufacturing method thereof. A poly-crystalline Group III nitride compound thin film is deposited on a substrate by sputtering at a deposition rate of 15 to 200 nm/hour using a Group III nitride compound target in a plasma atmosphere of gas comprising 10 mole % or more nitrogen. Then, the poly-crystalline Group III nitride compound semiconductor thin film deposited on the substrate is irradiated with an excimer pulsed laser with an energy-density of about 200 mJ/cm2, in an atmosphere of gas with an oxygen content of 2 mole % or less. Thereby, lattice defects such as grain boundaries or dislocations which occur in the thin film are removed.

15 Claims, 3 Drawing Sheets

GROUP III NITRIDE COMPOUND SEMICONDUCTOR THIN FILM AND DEPOSITION METHOD THEREOF, AND SEMICONDUCTOR DEVICE AND MANUFACTURING METHOD THEREOF

RELATED APPLICATION DATA

The present application claims priority to Japanese Application No. P11-205216 filed Jul. 19, 1999; which application is incorporated herein by reference to the extent permitted by law.

BACKGROUND OF THE INVENTION

1. Field of the Invention

The present invention relates to a Group III nitride compound semiconductor thin film comprising a Group III element such as aluminum (Al), gallium (Ga), indium (In) or boron (B), and nitrogen (N), and a deposition method thereof. The present invention also relates to a semiconductor device comprising such a Group III nitride compound semiconductor thin film, and a manufacturing method thereof.

2. Description of the Related Art

GaN (gallium nitride), InGaN (indium gallium nitride) compound crystal, GaAlN (gallium aluminum nitride) compound crystal and InAlGaN (indium aluminum gallium nitride) compound crystal are typical Group III nitride compound semiconductors. Group III nitride compound semiconductors are attractive as practical semiconductor materials applicable to light emitting devices such as a light emitting diode (LED) that emits blue light or a laser diode (LD) that emits blue light. Active exercise of research and development thereof is still going on.

In the related art practice, a Group III nitride compound semiconductor is grown on a substrate by MOCVD (Metal Organic Chemical Vapor Deposition), which is also called MOVPE (Metal Organic Vapor Phase Epitaxy), or by MBE (Molecular Beam Epitaxy) to be formed into a single-crystal thin film.

In MOCVD, a Group III nitride compound semiconductor is obtained through chemical reactions between material gases of a Group III element and nitrogen, and is heteroepitaxially grown on a substrate. MOCVD has an advantage that a single-crystal thin film having a uniform composition can be deposited on a substrate. MOCVD also allows the substrate temperature (growth temperature) to be set high. This contributes to another advantage of relative easiness of depositing a single-crystal thin film of excellent crystalline, or a single-crystal thin film having few lattice defects such as dislocations.

On the other hand, in MBE, a substrate is irradiated with particle beams of a Group III element and nitrogen, which are evaporated from a Knudsen cell, to grow a crystal thereon. Thus, MBE has a difficulty in forming a thin film of uniform composition and film thickness. In addition, MBE requires a low substrate temperature (growth temperature) in order to suppress desorption of nitrogen flom the surface of a thin film at the time of crystal growth. This makes it difficult to form a single-crystal thin film of excellent crystalline. Since the light emission efficiency of a light emitting device is said to depend largely on the crystalline of a thin film, MOCVD, which is practically effective, is frequently used with the current state of the art.

MOCVD, however, has a problem of the limited material and size of a substrate used. That is, a substrate used in MOCVD has to have a lattice constant substantially equal to that of a Group III nitride compound semiconductor to be grown thereon. Moreover, a substrate used in MOCVD has to have high heat resistance.

Present practice followed in growing a Group III nitride compound semiconductor is to use a crystalline sapphire ($\alpha$-$Al_2O_3$) substrate. Sapphire of this type has a lattice constant approximately equal to those of Group III nitride compound semiconductors, especially GaN. The sapphire also has excellent heat resistance. For these reasons, the sapphire is suitable for a material of substrates used in MOCVD.

The use of sapphire substrates, however, involves the growth on c surfaces. Thus, sapphire substrates have a problem in workability or formability, resulting in high materials cost.

Another problem with sapphire substrates is low production efficiency. Since it is difficult to deposit a thin film of uniform film thickness over the entire surface of a substrate, a substrate of large surface area cannot be used (with the current state of art, the maximum size is about 8 inches).

Furthermore, a single-crystal Group III nitride compound semiconductor thin film manufactured by MOCVD includes lattice defects such as dislocations at a rate of about $10^{10}$ $cm^{-2}$. The use of such a single-crystal Group III nitride compound semiconductor thin film as a luminescent material in an LED causes an increase in non-radiative recombination probability in which electrons recombine with holes without emitting radiation, resulting in a problem of deterioration in light emission efficiency.

SUMMARY OF THE INVENTION

The present invention has been achieved to overcome the above-described problems. A first object of the invention is to provide a Group III nitride compound semiconductor thin film which can, be deposited on any given substrate and a deposition method thereof, and a semiconductor device using such a Group III nitride compound semiconductor and a manufacturing method thereof.

A second object of the invention is to provide a Group III nitride compound semiconductor thin film of uniform film quality and excellent crystalline and a deposition method thereof, and a semiconductor device using such a Group III nitride compound semiconductor and a manufacturing method thereof.

A deposition method of a Group III nitride compound semiconductor thin film according to the invention is a method for depositing a Group III nitride compound semiconductor thin film comprising at least one Group III element and nitrogen, wherein a poly-crystalline Group III nitride compound semiconductor thin film is deposited on a substrate by sputtering using a target comprised of a Group III nitride compound in a plasma atmosphere of gas comprising at least nitrogen.

Another deposition method of a Group III nitride compound semiconductor thin film according to the invention comprises steps of: depositing, on a substrate, a poly-crystalline Group III nitride compound semiconductor thin film comprising at least one Group III element and nitrogen; and removing a lattice defect which occurs in the poly-crystalline Group III nitride compound semiconductor thin film, by irradiating the poly-crystalline Group III nitride compound semiconductor thin film deposited on the substrate with a pulsed laser.

Still another deposition method of a Group III nitride compound semiconductor thin film according to the invention comprises steps of: depositing, on a substrate, a single-crystal Group III nitride compound semiconductor thin film comprising at least one Group III element and nitrogen; and removing a lattice defect which occurs in the single-crystal Group III nitride compound semiconductor thin film, by irradiating the single-crystal Group III nitride compound semiconductor thin film deposited on the substrate with a pulsed laser.

A Group III nitride compound semiconductor thin film according to the invention is a Group III nitride compound semiconductor thin film comprising at least one Group III element and nitrogen, wherein the Group III nitride compound semiconductor thin film is deposited by sputtering using a target comprised of a Group III nitride compound in a plasma atmosphere of gas comprising at least nitrogen, and has a poly-crystalline structure.

A manufacturing method of a semiconductor device according to the invention is a manufacturing method of a semiconductor device comprising a Group III nitride compound semiconductor layer comprising at least one Group III element and nitrogen, wherein a poly-crystalline Group III nitride compound semiconductor layer is deposited on a substrate by sputtering using a target comprised of a Group III nitride compound in a plasma atmosphere of gas comprising at least nitrogen.

Another manufacturing method of a semiconductor device according to the invention is a manufacturing method of a semiconductor device comprising a Group III nitride compound semiconductor layer comprising at least one Group III element and nitrogen, the method comprising steps of: depositing, on a substrate, a poly-crystalline Group III nitride compound semiconductor layer comprising at least one Group III element and nitrogen; and removing a lattice defect which occurs in the poly-crystalline Group III nitride compound semiconductor layer, by irradiating the poly-crystalline Group III nitride compound semiconductor layer deposited on the substrate with a pulsed laser.

Still another manufacturing method of a semiconductor device according to the invention is a manufacturing method of a semiconductor device comprising a Group III nitride compound semiconductor layer comprising at least one Group III element and nitrogen, the method comprising steps of: depositing, on a substrate, a single-crystal Group III nitride compound semiconductor layer comprising at least one Group III element and nitrogen; and removing a lattice defect which occurs in the single-crystal Group III nitride compound semiconductor layer, by irradiating the single-crystal Group III nitride compound semiconductor layer deposited on the substrate with a pulsed laser.

A semiconductor device according to the invention is a semiconductor device comprising a Group III nitride compound semiconductor layer comprising at least one Group III element and nitrogen, wherein the Group III nitride compound semiconductor layer is deposited by sputtering using a target comprised of a Group III nitride compound in a plasma atmosphere of gas comprising at least nitrogen, and has a poly-crystalline structure.

In a deposition method of a Group III nitride compound semiconductor thin film according to the invention, a poly-crystalline Group III nitride compound semiconductor thin film is deposited by sputtering using a Group III nitride compound target in a plasma atmosphere of gas comprising at least nitrogen. Thus, a Group III nitride compound semiconductor thin film of the invention is obtained.

In another deposition method of a Group III nitride compound semiconductor thin film according to the invention, a poly-crystalline Group III nitride compound semiconductor thin film is deposited, and then the poly-crystalline Group III nitride compound semiconductor thin film is irradiated with a pulsed laser.

In still another deposition method of a Group III nitride compound semiconductor thin film according to the invention, a single-crystal Group III nitride compound semiconductor thin film is deposited, and then the single-crystal Group III nitride compound semiconductor thin film is irradiated with a pulsed laser.

In a manufacturing method of a semiconductor device according to the invention, a poly-crystalline Group III nitride compound semiconductor layer is deposited by the deposition method of a Group III nitride compound semiconductor thin film. Thus, a semiconductor device of the invention is obtained.

In another manufacturing method of a semiconductor device according to the invention, a poly-crystalline Group III nitride compound semiconductor layer is deposited by, for example, sputtering, and then the poly-crystalline Group III nitride compound semiconductor layer is irradiated with a pulsed laser.

In still another manufacturing method of a semiconductor device according to the invention, a single-crystal Group III nitride compound semiconductor layer is deposited by, for example, epitaxial growth, and then the single-crystal Group III nitride compound semiconductor layer is irradiated with a pulsed laser.

Other and further objects, features and advantages of the invention will appear more fully from the following description.

DETAILED DESCRIPTION OF THE PREFERRED EMBODIMENTS

Figure 1:
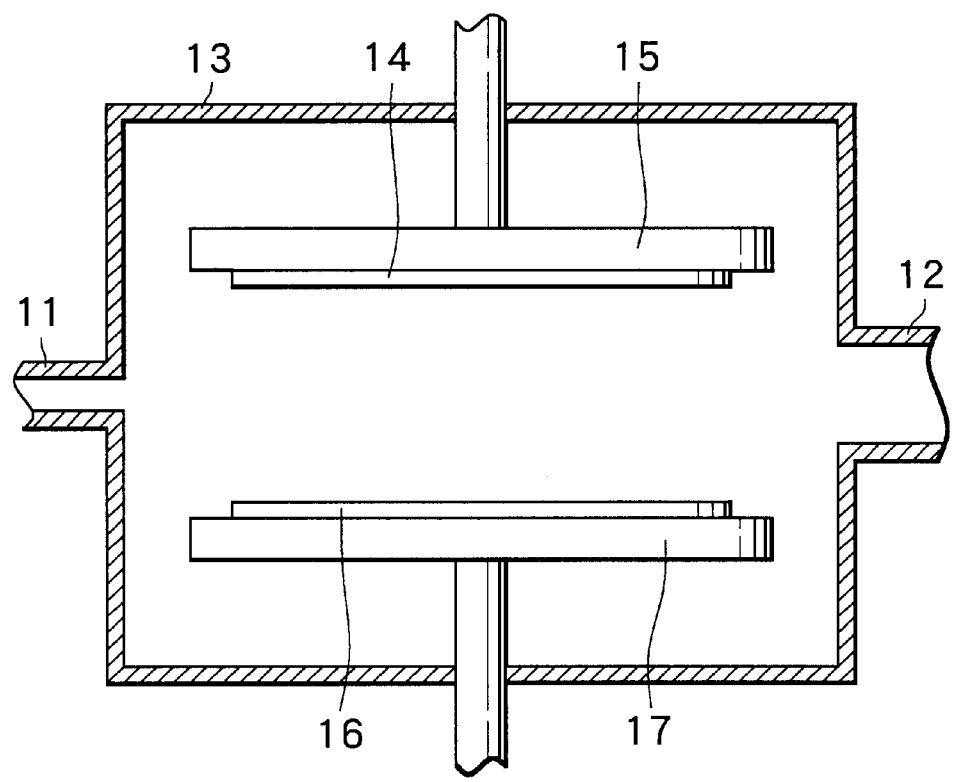
FIG. 1 is a schematic cross section for illustrating a construction of a sputtering system used in a deposition method of a Group III nitride compound semiconductor thin film according to a first embodiment of the invention.

Embodiments of the invention will now be described in detail below by referring to the drawings.

First Embodiment

A deposition method of a Group III nitride compound semiconductor thin film according to the first embodiment of the invention involves the deposition of a poly-crystalline Group III nitride compound semiconductor thin film comprising, for example, at least one Group III element from the group consisting of aluminum, gallium, indium and boron, and nitrogen. Examples of such Group III nitride compound semiconductors are GaN, InN, AlN, BN, InGaN compound crystal, GaAlN compound crystal and InAlGaN compound crystal. The Group III nitride compound semiconductors may comprise n-type impurities such as silicon (Si) or p-type impurities such as magnesium (Mg) as necessary. The Group III nitride compound semiconductor thin film according to the present embodiment is embodied by the deposition method of the present embodiment and will be incorporated in the description given below.

FIG. 1 illustrates a schematic construction of a sputtering system used in a deposition method of a Group III nitride compound semiconductor thin film according to the embodiment. The sputtering system comprises, for example, a vacuum chamber 13 made of stainless steel. A gas supply pipe 11 and a gas exhaust pipe 12 is connected to the vacuum chamber 13. Inside the vacuum chamber 13, a substrate holder 15 for mounting a substrate 14 and a target mounting plate 17 for mounting a target 16 are arranged to face each other. The sputtering system is shown provided with one target mounting plate 17, but the sputtering system may be also provided with a plurality of target mounting plates 17. A voltage can be applied to the target 16 by an RF power source, although not shown, which is provided outside the vacuum chamber 13. A heating means such as a heater, although not shown, is provided inside the vacuum chamber 13, and the substrate 14 is heated by the heating means. The vacuum chamber 13 is further provided therein with an excimer laser, which will be described later in detail. In the sputtering system, gas in the vacuum chamber is exhausted via the gas exhaust pipe 12, and thereby the pressure in the vacuum chamber is reduced to a vacuum condition of, for example, about $5.0 \times 10^{-7}$ Torr. Then, predetermined gas is supplied via the gas supply pipe 11, and thus the atmosphere in the chamber becomes an atmosphere of the gas supplied.

In the embodiment, the sputtering system as described above is used in RF (Radio Frequency) sputtering to deposit a poly-crystalline Group III nitride compound semiconductor thin film as follows.

First, the substrate 14 of any given size, shape and thickness suitable for its application is mounted on a mounting surface of the substrate holder 15. The substrate 14 may be, for example, a glass substrate, a ceramic substrate, a gallium nitride substrate, a silicon substrate, a silicon carbide substrate, a resin substrate made of, for example, polycarbonate resin, a poly (ethylene terephthalate) resin, a polyester resin, an epoxy resin, an acrylic resin or an ABS (Acrylonitrile-Butadiene-Styrene copolymer) resin, or an appropriate metal substrate.

Then, a predetermined Group III nitride compound target such as GaN is mounted on the target mounting plate 17. In addition to a Group III nitride compound target as mentioned above, a single substance target of a Group III element may be possible. However, a Group III nitride compound target is preferred for several reasons. First, the use of a Group III nitride compound target enables the formation of a Group III nitride compound semiconductor of stoichiometric composition or of nearly stoichiometric composition with stability, as compared with the case with the use of a single substance target of a Group III element. Secondly, when producing a Group III nitride compound semiconductor comprising gallium as a Group III element, the use of a gallium metal target as a single substance target causes a problem that gallium sputtered from the target becomes attached to and diffused into the inside surfaces of the vacuum chamber 13 to cause corrosion of the vacuum chamber 13. Moreover, since the melting point of gallium is as low as 29.78° C., a gallium metal target is in liquid state at the time of sputtering. Therefore, the use of a gallium metal target requires a device for preventing liquid leaks.

Next, the gas in the vacuum chamber 13 is exhausted via the gas exhaust pipe 12, and thereby the pressure in the vacuum chamber 13 is reduced to a predetermined pressure of, for example, 5.0 107 Torr. Subsequently, the substrate 14 is heated to a prescribed temperature lower than, for example, 900 C, and then gas comprising at least nitrogen is introduced via the gas supply pipe 11 into the vacuum chamber 13 to reach a prescribed pressure of, for example, 17 mTorr. Preferably, the gas comprises 10 mole % or more nitrogen in a plasma condition inside the vacuum chamber 13.

After that, a voltage is applied to the target 16 with a power of, for example, 10 W from the RF power source. Thereby, the atmosphere inside the vacuum chamber 13 is made a plasma atmosphere of gas comprising nitrogen, while sputtering is initiated. Thus, a Group III nitride compound semiconductor is deposited over the substrate to a prescribed thickness.

In this case, preferably, the deposition rate is in the range of 15 to 200 nm/hour and more preferably 15 to 70 nm/hour. If the deposition rate is smaller than 15 nm/hour, RF power is too small and the plasma becomes unstable. This causes deterioration in reproducibility of the composition of the poly-crystalline Group III nitride compound semiconductor thin film thus obtained. On the other hand, if the deposition rate is greater than 200 nm/hour, there occurs more lattice defects such as grain boundaries or dislocations per unit volume of the poly-crystalline Group III nitride compound semiconductor thin film thus obtained. This results in deterioration in the crystalline of the poly-crystalline Group III nitride compound semiconductor thin film.

Preferably, the plasma of the gas comprising nitrogen comprises 10 mole % or more nitrogen and more preferably 80 mole % or more nitrogen. If the nitrogen content is smaller than 10 mole %, the Group III nitride compound semiconductor becomes deficient in nitrogen, and therefore, an essential semiconductor property of the Group III nitride compound semiconductor does not become manifest. By sputtering in a plasma atmosphere comprising 10 mole % or more nitrogen, obtained is a clear thin film of nearly stoichiometric composition. On the other hand, by sputtering in a plasma atmosphere of 100% argon gas, obtained is a black thin film in which a composition ratio of gallium is extremely larger than a stoichiometric composition. This thin film has a resistivity of about 104 cm and exhibits high electrical conductivity. This thin film is so fragile that it is crushed in the scratch test.

Figure 2:
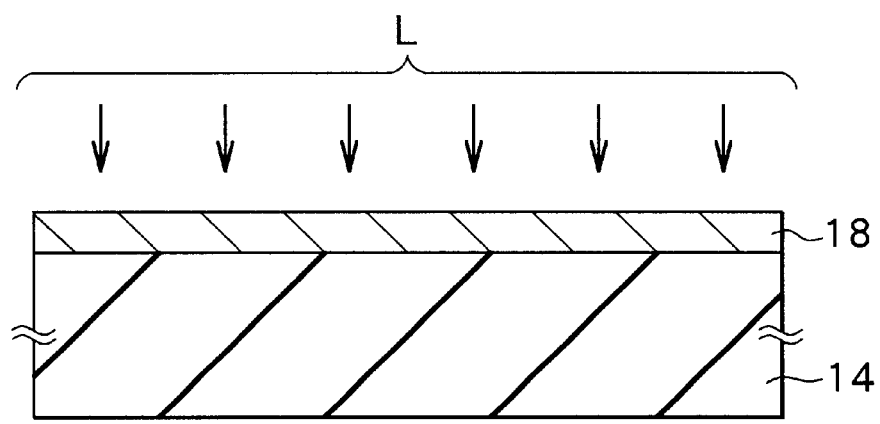
FIG. 2 is a cross section for illustrating a step of the deposition method of a Group III nitride compound semiconductor thin film according to the first embodiment of the invention.

After depositing the poly-crystalline Group III nitride compound semiconductor thin film, as shown in FIG. 2, the poly-crystalline Group III nitride compound semiconductor thin film 18 deposited over the substrate 14 is irradiated with a pulsed laser L using, for example, an excimer laser, although not shown, provided in the vacuum chamber 13, and thus the poly-crystalline Group III nitride compound semiconductor thin film 18 is heated. Specifically, the poly-crystalline Group III nitride compound semiconductor thin film 18 is irradiated with an energy density of about 200 mJ/cm$^2$ in an atmosphere of gas with an oxygen content of 2 mole % or less and preferably 0.5 mole % or less. Thereby, part or all of grain boundaries, dislocations and other lattice defects are removed and the number of lattice defects is reduced. This contributes to an improvement in the crystalline of the poly-crystalline Group III nitride compound semiconductor thin film 18.

The reason for laser irradiation in an atmosphere of gas with an oxygen content of 2 mole % or less is given as follows. In a gaseous atmosphere with a high oxygen content, laser irradiation turns the poly-crystalline Group III nitride compound semiconductor thin film 18 into a compound crystal Group III nitride compound semiconductor thin film comprising an oxide microcrystal. Thus, an essential semiconductor property of a Group III nitride compound semiconductor does not become manifest. It is therefore preferable that an oxygen content in the thin film be smaller than or equal to 2 mole %. Moreover, setting the irradiation energy density at about 200 mJ/cm$^2$ prevents nitrogen from being struck out of the surface of the thin film.

The excimer laser may be an excimer pulsed laser of wavelengths in the ultraviolet region such as XeCl of a wavelength of 308 nm, XeF of a wavelength of 351 nm, XeBr of a wavelength of 282 nm, KrF of a wavelength of 248 nm or KrCl of a wavelength of 222 nm.

The deposition method of a Group III nitride compound semiconductor according to the embodiment is utilized in a manufacturing method of a semiconductor device as described below.

Figure 3A:
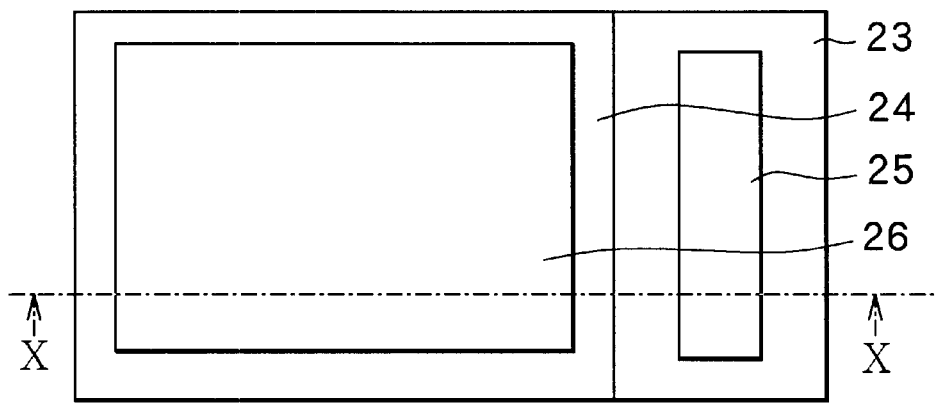
FIG. 3A is a plan view illustrating a configuration of an LED manufactured by the deposition method of a Group III nitride compound semiconductor thin film according to the first embodiment of the invention.
Figure 3B:
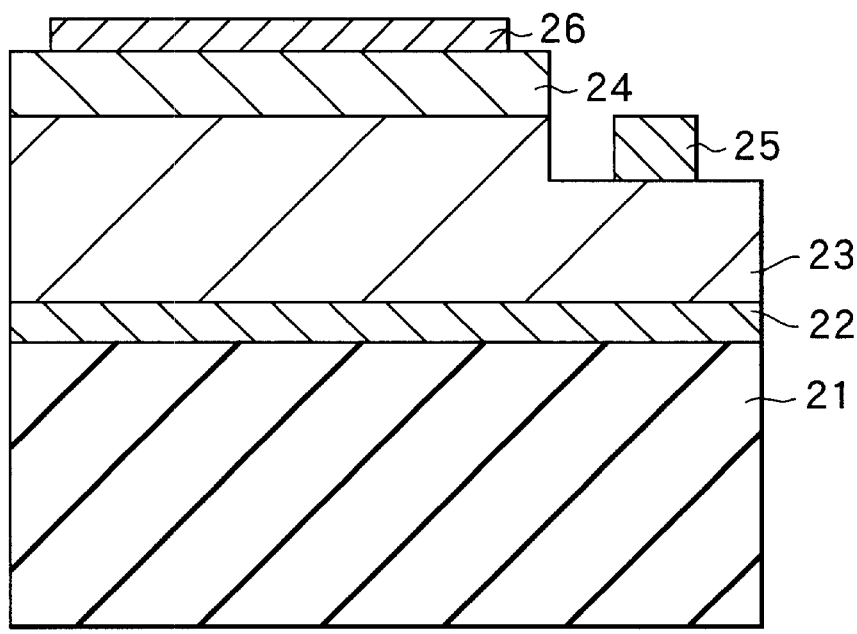
FIG. 3B is a cross section taken along line X—X of FIG. 3A.

FIGS. 3A and 3B illustrate a configuration of an LED as a semiconductor device manufactured by the deposition method according to the embodiment. FIG. 3A is a plan view seen from the electrode side and FIG. 3B is a cross section taken along line X—X of FIG. 3A.

First, a clear substrate 21 made of, for example, quartz is mounted on the mounting surface of the substrate holder 15. Then, an AlN target, a GaN target with silicon mixed therein as n-type impurities and a GaN target with, for example, a high content of magnesium mixed therein as p-type impurities are mounted on the target mounting plate 17.

Next, the gas in the vacuum chamber 13 is exhausted via the gas exhaust pipe 12, and thereby the pressure in the vacuum chamber 13 is reduced to a pressure of, for example, $5.0\times10^{-7}$ Torr. Subsequently, the clear substrate 21 is heated using a heating means such as a heater to, for example, 700 to 850° C., and then gas comprising, for example, 10 mole % or more nitrogen is introduced via the gas supply pipe 11 into the vacuum chamber 13 to reach a pressure of, for example, 17 mTorr.

After that, a voltage is applied to the AlN target with a power of, example, 50 W from the RF power soure. Thereby, inside the vacuum chamber 13, the above-described gas turns into plasma condition to become a plasma atmosphere of gas comprising nitrogen, while sputtering is initiated. Thus, buffer layer 22 comprised of poly-crystalline AlN having a thickness of, for example, 30 nm is depodited on the clear substrate 21.

Next, the buffer layer 22 is subjected to excimer pulsed laser irradiation using, for example, an excimer laser, although not shown, provided in the vacuum chamber 13, and thus the buffer layer 22 is heated. Specifically, laser irradiation is performed with an energy density of about 200 mJ/cm$^2$ in an atmosphere of gas with an oxygen content of 2 mole % or less and preferably 0.5 mole % or less. Thereby, grain boundaries, dislocations and other lattice defects are suppressed. This contributes to an improvement in the crystalline of poly-crystalline AlN.

After laser irradiation of the buffer layer 22, a voltage is applied to the GaN target having n-type impurities mixed therein, and a poly-crystalline n-type GaN layer 23 having a thickness of, for example, 2 $\mu$m is deposited on the buffer layer 22. Then, the poly-crystalline n-type GaN layer 23 is subjected to laser irradiation as in the case of, for example, the buffer layer 22.

Furthermore, a voltage is applied to the GaN target having p-type impurities mixed therein, and a poly-crystalline p-type GaN layer 24 having a thickness of, for example, 100 nm is deposited on the poly-crystalline n-type GaN layer 23. Then, the poly-crystalline p-type GaN layer 24 is subjected to laser irradiation. As described above, the poly-crystalline p-type GaN layer 24 is deposited using the GaN target with a high content of p-type impurities mixed therein as described above, and therefore exhibits high resistivity.

Next, on the poly-crystalline p-type GaN layer 24, a resist pattern in stripes, although not shown, is formed in correspondence with the position where an n-side electrode 25 is to be formed. After that, the poly-crystalline p-type GaN layer 24 is selectively removed with the resist pattern as a mask by, for example, RIE (Reactive Ion Etching). Thus, the poly-crystalline n-type GaN layer is exposed.

Then, the resist pattern is removed off. On the poly-crystalline p-type GaN layer 24, for example, a nickel (Ni) layer, a platinum (Pt) layer and a gold (Au) layer is deposited in the order named, and a p-side electrode 26 is formed nearly over the entire surface of the poly-crystalline p-type GaN layer 24. Since the p-side electrode 26 is formed nearly over the entire surface of the poly-crystalline p-type GaN layer 24, the poly-crystalline p-type GaN layer 24 and the p-side electrode 26 are in contact with each other in a broad area. As a result, a forward voltage at the time of energization of the electrode is reduced, and light emission is attained nearly throughout the entire surface of the poly-crystalline p-type GaN layer 24. Furthermore, on the poly-crystalline n-type GaN layer 23 thus exposed, for example, a titanium (Ti) layer, an aluminum (Al) layer, a platinum layer and a gold layer are deposited in the order named, and thus the n-side electrode 25 is formed. After that, through heat treatments, the n-side electrode 25 and the p-side electrode 26 are alloyed. Thus, an LED as shown in FIGS. 3A and 3B is completed.

In an LED thus manufactured, if a prescribed voltage is applied between the n-side electrode 25 and the p-side electrode 26, a current is fed to the poly-crystalline p-type GaN layer 24, and light emission is achieved through electron-hole recombination. Since the poly-crystalline n-type GaN layer 23 and the poly-crystalline p-type GaN layer 24 have high crystalline, the layers 23 and 24 have high carrier mobility and small resistivity. This contributes to high light emission efficiency.

As described above, according to the deposition method of a Group III nitride compound semiconductor thin film of the embodiment, a poly-crystalline Group III nitride compound semiconductor thin film is deposited by sputtering. This enables the deposition of a poly-crystalline Group III nitride compound semiconductor thin film excellent in uniformity in film thickness and composition (that is, film quality). Moreover, since the temperature at the time of the deposition of a thin film can be set at 30 to 700° C., it becomes unnecessary to use a substrate having high heat resistance, as distinct from the deposition of a thin film by epitaxial growth. This makes it possible to deposit a thin film on a substrate of any given material and of large surface area, which contributes to cost reduction.

Furthermore, according to the deposition method of a Group III nitride compound semiconductor thin film of the embodiment, a poly-crystalline Group III nitride compound semiconductor thin film is irradiated with a pulsed laser, and thereby lattice defects which occur in the thin film are removed. This enables the deposition of a thin film of improved crystalline. As a result, the resistivity is reduced and the carrier mobility is increased.

The application of the poly-crystalline Group III nitride compound semiconductor thin film of the embodiment to a semiconductor light emitting device such as an LED enables a reduction in the probability of non-radiative recombination where electrons recombine with holes without emitting radiation due to lattice defects or others. Therefore, the semiconductor light emitting device can expect an improved light emission efficiency. The semiconductor light emitting device can also expect a long life and a great light emission intensity.

Second Embodiment

A deposition method of a Group III nitride compound semiconductor thin film according to a second embodiment of the invention involves the deposition of a single-crystal Group III nitride compound semiconductor thin film comprising at least one Group III element from the group consisting of aluminum, gallium, indium and boron, and nitrogen, by MOVPE as heteroepitaxial growth. Description given below relates to the case of a single-crystal n-type GaN thin film as an example of a single-crystal Group III nitride compound semiconductor thin film.

In the embodiment, first, a clear substrate comprised of, for example, cleaned c-surfaced sapphire is carried into an MOVPE system. The sapphire substrate is dry etched at the substrate temperature of 1050° C. while hydrogen (H) gas is supplied into the system at the rate of 2 liters per minute at atmospheric pressure. Thereby, an oxide layer of low crystalline, which forms the top surface of the clear substrate, is removed. This enables epitaxial growth of high quality thereon.

Then, the temperature of the clear substrate is set at, for example, 400° C. After that, hydrogen gas as carrier gas, ammonia ($NH_3$) gas for deriving nitrogen therefrom and trimethylaluminum (($CH_3)_3Al$) for deriving aluminum therefrom are introduced into the MOVPE system at the rate of, for example, 20 liters per minute, 10 liters per minute, and $1.8 \times 10^{-5}$ mole per minute, respectively. Thus, a buffer layer comprised of single-crystal AlN having a thickness of, for example, 0.05 μm is deposited on the clear substrate.

Subsequently, the temperature of the clear substrate is set at, for example, 1000° C. After that, while the substrate temperature is maintained there, hydrogen gas, ammonia gas, trimethylgallium (($CH_3)_3Ga$) for deriving gallium therefrom and silane ($SiH_4$) gas diluted to 0.88 ppm with hydrogen gas, for deriving n-type impurities therefrom, are introduced into the system for 30 minutes at the rate of, for example, 20 liters per minute, 10 liters per minute, and $1.8 \times 10^{-4}$ mole per minute, and 200 milliliters per minute, respectively. Thus, on the buffer layer, deposited is a single-crystal n-type GaN thin film having a film thickness of, for example, 2.2 μm and a carrier density of, for example, $7.8 \times 10^{18}$ $cm^{-3}$.

The single-crystal n-type GaN thin film thus obtained is subjected to laser irradiation using, for example, an excimer laser, and thus the thin film is heated. Specifically, laser irradiation is carried out with an energy density of 100 $mJ/cm^2$ in an atmosphere of gas with a nitrogen content of 95 mole % or more and preferably 99 mole % or more. Thereby, part or all of dislocations and other lattice defects are removed, and the number of lattice defects is reduced. This contributes to an improvement in the crystalline of the single-crystal n-type GaN thin film. The reason for laser irradiation in an atmosphere of gas with a nitrogen content of 95 mole % or more is as follows. If a nitrogen content in the thin film is low, the thin film becomes deficient in nitrogen in the neighborhood of its surface, and the crystalline of the thin film deteriorates while the resistivity of the thin film rapidly increases. Setting the energy density at about 100 $mJ/cm^2$ prevents nitrogen from being struck out of the surface of the thin film.

Research of light emission characteristics of the single-crystal n-type GaN thin film thus completed and the single-crystal n-type GaN thin film before subjected to excimer laser irradiation shows that the thin film after subjected to laser irradiation has greater light emission intensity than the thin film before subjected to irradiation. The possible reason is a reduction in lattice defects which occur in the thin film and a reduction in energy traps which may serve as centers of non-radiative recombination due to lattice defects.

The deposition method of a Group III nitride compound semiconductor thin film according to the embodiment is applicable to a manufacturing method of a semiconductor device such as an LED, as in the first embodiment.

As described above, according to the deposition method of a Group III nitride compound semiconductor thin film of the embodiment, the single-crystal Group III nitride compound semiconductor thin film is irradiated with a laser, and thereby lattice defects which occur in the thin film are removed. This enables the deposition of a thin film of high crystalline, resulting in a reduction in resistivity and an increase in carrier mobility.

The application of the single-crystal Group III nitride compound semiconductor thin film of the embodiment to the manufacture of a semiconductor light emitting device as an LED enables a reduction in the probability of non-radiative recombination where electrons recombine with holes without emitting radiation due to lattice defects or others. This further achieves enhancement of light emission efficiency, a longer life of a semiconductor light emitting device and an increase in light emission intensity.

EXAMPLE

Description now moves to the details of specific examples of the present invention.

Example 1

First, a clear substrate made of cultured quartz having translucency was prepared. The dimensions of the clear substrate, i.e., length, width and height, were 125 mm, 125 mm and 1 mm, respectively. The clear substrate was cleaned with a neutral detergent, washed in water, and then subjected to ultrasonic cleaning with an organic solvent.

Then, the clear substrate was mounted on the substrate holder 15 of a sputtering system similar to the sputtering system shown in FIG. 1. Subsequently, a GaN target, i.e., the target 16, in the form of disk 3 inches in diameter and 5 mm in thickness was prepared. The GaN target was mounted on the target mounting plate 17. The distance between the clear substrate and the GaN target was set at 150 mm.

Next, the gas in the vacuum chamber 13 was exhausted via the gas exhaust pipe 12, and thereby the pressure in the vacuum chamber 13 was reduced to a pressure of $5.0 \times 10^{-7}$ Torr. Subsequently, the clear substrate was heated to 850° C., and then nitrogen gas, i.e., gas with a nitrogen content of 100 mole %, was introduced via the gas supply pipe 11 into the vacuum chamber 13 at a rate of 100 sccm to a pressure of 17 mTorr.

After that, a voltage was applied to the GaN target with a power of 10 W from the RF power source. Thereby, the atmosphere inside the vacuum chamber 13 was made a plasma atmosphere of nitrogen gas, while sputtering was initiated. Sputtering was carried out for 390 minutes, and a GaN thin film having a film thickness of 0.1 m was obtained. The deposition rate was therefore 15.4 nm/hour. The substrate temperature was maintained at 850 C throughout sputtering.

Example 2

A GaN thin film having a film thickness of 0.1 $\mu$m was obtained as in Example 1 except that the RF power was 20 W and sputtering time was 180 minutes. The deposition rate was therefore 33.3 nm/hour.

Example 3

A GaN thin film having a film thickness of 0.1 $\mu$m was obtained as in Example 1 except that the RF power was 30 W and sputtering time was 120 minutes. The deposition rate was therefore 50 nm/hour.

Example 4

A GaN thin film having a film thickness of 0.1 $\mu$m was obtained as in Example 1 except that the RF power was 50 W and sputtering time was 60 minutes. The deposition rate was therefore 100 nm/hour.

Example 5

A GaN thin film having a film thickness of 0.1 $\mu$m was obtained as in Example 2 except that the substrate temperature at the time of sputtering was 750° C.

Example 6

A poly-crystalline GaN thin film having a film thickness of 0.1 $\mu$m was obtained as in Example 2 except that the substrate temperature at the time of sputtering was 600° C.

Example 7

An InGaN thin film having a film thickness of 0.1 $\mu$m was obtained as in Example 1 except for the use of an InGaN target instead of the GaN target. The InGaN target had a gallium to indium content ratio by mole of 9 to 1.

Example 8

A GaAlN thin film having a film thickness of 0.1 $\mu$m was obtained as in Example 1 except for the use of a GaAlN target instead of the GaN target. The GaAlN target had a gallium to aluminum content ratio by mole of 9 to 1.

Example 9

A GaN thin film having a film thickness of 0.1 $\mu$m was obtained as in Example 1 except that nitrogen-argon (Ar) mixed gas with a nitrogen content of 10 mole % was introduced into the vacuum chamber, instead of nitrogen gas.

Example 10

A GaN thin film having a film thickness of 0.1 $\mu$m was obtained as in Example 1 except that nitrogen-argon mixed gas with a nitrogen content of 50 mole % was introduced into the vacuum chamber, instead of nitrogen gas.

The following Comparative Examples 1 to 4 were carried out with respect to Examples 1 to 4 above.

Comparative Example 1

A GaN thin film having a film thickness of 0.1 $\mu$m was obtained as in Example 1 except that the RF power was 100 W and sputtering time was 30 minutes. The deposition rate was therefore 200 nm/hour.

Comparative Example 2

A GaN thin film having a film thickness of 0.1 $\mu$m was obtained as in Example 1 except that the RF power was 200 W and sputtering time was 15 minutes. The deposition rate was therefore 400 nm/hour.

Comparative Example 3

A GaN thin film having a film thickness of 0.1 $\mu$m was obtained as in Example 1 except that reactive sputtering was conducted using a gallium metal target instead of the GaN target.

Comparative Example 4

A GaN thin film having a film thickness of 0.1 $\mu$m was obtained as in Example 1 except that argon gas, i.e., gas with an argon content of 100 mole %, was introduced into the vacuum chamber, instead of nitrogen gas.

Each thin film obtained in Examples 1 to 10 and Comparative Examples 1 to 4 was subjected to composition analysis by RBS (Rutherford Back Scattering), an evaluation of light emission characteristics by CL (Cathodoluminescence) measurements and an evaluation of electrical characteristics by Hall effect measurements.

The RBS measurements were made by irradiating each thin film with He$^{++}$ accelerated to 2.275 MeV. The conditions of the measurements were as follows: the incident angle of the beam was 0°; the vertical detector was set at an angle of 160°; and the inclined detector was set at an angle of about 110° or about 100°. The results are summarized in Table 1 below.

TABLE 1

| | Composition of thin film | CL emmission peak wavelength (nm) | Resistivity ($\Omega$cm) | Carrier density (cm$^3$) |
|---|---|---|---|---|
| Example 1 | $Ga_{0.46}N_{0.54}$ | 380 | 14.7 | $-9.9 \times 10^{17}$ |
| Example 2 | $Ga_{0.458}N_{0.542}$ | 381 | 10.6 | $-5.8 \times 10^{17}$ |
| Example 3 | $Ga_{0.46}N_{0.54}$ | 380 | 24.0 | $-8.3 \times 10^{17}$ |
| Example 4 | $Ga_{0.458}N_{0.542}$ | 380 | 16.8 | $-9.4 \times 10^{17}$ |
| Example 5 | $Ga_{0.458}N_{0.542}$ | 381 | 21.2 | $-8.9 \times 10^{17}$ |
| Example 6 | $Ga_{0.46}N_{0.54}$ | no emission | beyond measuring range | below detection range |
| Example 7 | $Ga_{0.43}In_{0.08}N_{0.49}$ | 431 | 11.3 | $-6.3 \times 10^{17}$ |
| Example 8 | $Ga_{0.469}Al_{0.06}N_{0.471}$ | 380 | 13.6 | $-7.7 \times 10^{17}$ |
| Example 9 | $Ga_{0.46}N_{0.54}$ | no emission | beyond measuring range | below detection range |
| Example 10 | $Ga_{0.461}N_{0.539}$ | no emission | beyond measuring range | below detection range |
| Comparative Example 1 | $Ga_{0.457}N_{0.503}O_{0.04}$ | no emission | beyond measuring range | below detection range |
| Comparative Example 2 | $Ga_{0.459}N_{0.501}O_{0.04}$ | no emission | beyond measuring range | below detection range |
| Comparative Example 3 | $Ga_{0.64}N_{0.30}O_{0.06}$ | no emission | beyond measuring range | below detection range |
| Comparative Example 4 | $Ga_{0.91}N_{0.09}$ | no emission | $8 \times 10^{-3}$ | $-8.1 \times 10^{20}$ |

As understood from Table 1, it was confirmed that the GaN thin films of Examples 1 to 6, 9 and 10 did not comprise oxygen but gallium and nitrogen. XRD (X-ray Diffraction) measurements of the thin films and microscope observation of the thin films using a TEM (Transmission Electron Microscope) revealed that the thin films had poly-crystalline structures. It was also confirmed that the Example 7 InGaN thin film did not comprise oxygen but gallium, indium and nitrogen, and had a poly-crystalline structure. It was further confirmed that the Example 8 GaAlN thin film did not comprise oxygen but gallium, aluminum and nitrogen, and had a poly-crystalline structure. On the other hand, it was confirmed that the thin films of Comparative Examples 1 to 3 had poly-crystalline structures, but comprised 4 to 6 mole % oxygen and had oxides or others mixed therein. With respect to Comparative Example 4, it was confirmed that GaN was produced but comprised only 9 mole % nitrogen. Furthermore, XRD measurements of the Comparative Example 4 thin film revealed that the main component of the thin film was gallium metal.

Figure 4:
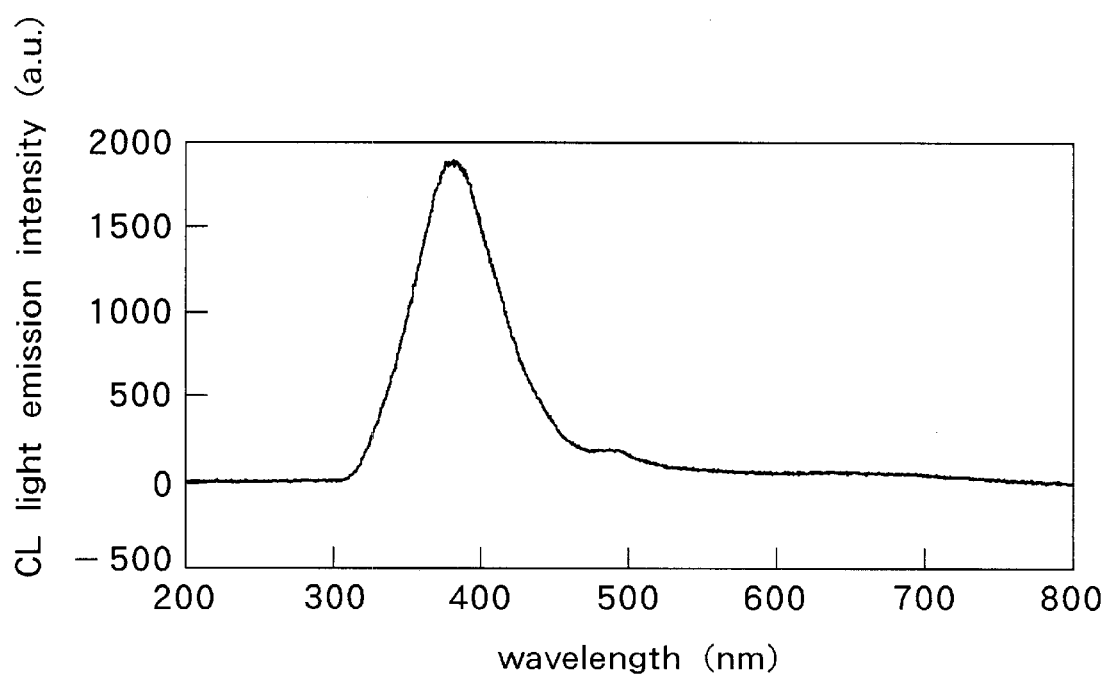
FIG. 4 is a characteristic figure showing a CL emission spectrum of a Group III nitride compound semiconductor thin film according to Example 1 of the invention.

The conditions of CL measurements were as follows: an electron beam was accelerated at an acceleration voltage (anode voltage) of 4 kV; the spectrum sampling time was 1 sec. The optical detector used was a photodiode array. The anode current was 5 $\mu$A. The CL emission spectrum with respect to the Example 1 poly-crystalline GaN thin film is shown in FIG. 4, wherein the vertical axis denotes light emission intensity and the abscissa axis denotes wavelength in the unit nm. The peak wavelength in the CL emission spectrum obtained in each thin film of Examples and Comparative Examples is also summarized in Table 1.

As seen from FIG. 4, with respect to the Example 1 poly-crystalline GaN thin film, the peak of the CL light emission intensity was found at a wavelength of about 380 nm, which was probably because of forbidden transition light emission. It was thus confirmed that this poly-crystalline GaN thin film had a property as a luminescent material. As also understood from Table 1, with respect to the poly-crystalline GaN thin films of Examples 2 to 5 and the poly-crystalline AlGaN thin film of Example 8, the peak of the CL light emission intensity was found at a wavelength of 380 nm or 381 nm. Further, with respect to the Example 7 poly-crystalline GaInN thin film, the peak of the CL light emission intensity was found at a wavelength of 431 nm, which was probably an superposed spectrum of forbidden transition light emission of GaN and InN. It was thus confirmed that the Example 7 poly-crystalline GaInN thin film had a property as a luminescent material. On the other hand, with respect to the poly-crystalline GaN thin films of Examples 6, 9 and 10, no peak of the CL light emission intensity was found. Thus, these thin films were found to lack a property as a luminescent material. With respect to the thin films of Comparative Examples 1 to 4, no CL light emission spectrum was found. Thus, these thin film were also found to lack a property as a luminescent material.

The measuring instrument used in the Hall effect measurements was HL5500C manufactured by Nippon Bio-Rad Laboratories KK. The results obtained are also summarized in Table 1. In Table 1, the measured values of the carrier density are prefixed with either a+sign or a−sign, thereby clearly disclosing the kind of the carrier, i.e., a hole or an electron, respectively.

As understood from Table 1, the poly-crystalline GaN thin films of Examples 1 to 5 had the resistivity in the range of 10 to 25 $\Omega$cm and the carrier density of the order of $-1.0 \times 10^{17}$ cm$^{-3}$, and were found to have n-type semiconductor characteristics. The Example 7 poly-crystalline InGaN thin film and the Example 8 poly-crystalline AlGaN thin film also had the resistivity in the range of 10 to 25 $\Omega$cm and the carrier density of the order of $-1.0 \times 10^{17}$ cm$^{-3}$, and were found to have n-type semiconductor characteristics. On the other hand, with respect to the poly-crystalline GaN thin films of Examples 6, 9 and 10, the resistivity was beyond the measuring range while the carrier density was below the detection range. Thus, it was found that these thin films had a high insulating characteristic and did not exhibit semiconductor characteristics. With respect to the thin films of Comparative Examples 1 to 4, the resistivity was also beyond the measuring range while the carrier density was below the detection range. Thus, it was found that these thin films had a high insulating characteristic and did not exhibit semiconductor characteristics.

Example 11

A poly-crystalline GaN thin film was deposited as in Example 6 except for the use of a non alkaline glass substrate having translucency instead of the clear substrate made of cultured quartz. The poly-crystalline GaN thin film thus obtained was irradiated with a pulsed laser with an energy density of 200 mJ/cm$^2$ using a XeCl excimer laser, although not shown, provided inside the vacuum chamber 13. The conditions of irradiation were as follows. Inside the vacuum chamber 13, the pressure was adjusted to 760 Torr and the atmosphere inside was an atmosphere of nitrogen gas. The pulsed laser beam was produced with an energy of 670 mJ at a frequency of 200 Hz with a pulse length of 25 ns, beam size of 150×0.35 mm$^2$ and an overlap area length of 0.035 mm. The temperature of the clear substrate was set at 25° C.

Comparative Examples 5 and 6

Comparative Examples 5 and 6 were carried out with respect to Example 11. In Comparative Example 5, laser irradiation was conducted as in Example 11 except for the use of a He—Ne laser of a wavelength of 633 nm, instead of a XeCl excimer laser. In Comparative Example 6, ultra-violet irradiation was performed as in Example 11 except for the use of a Hg—Xe ultraviolet lamp of main peak of 360 nm, instead of a XeCl excimer laser.

With respect to the thin films thus obtained in Example 11, and Comparative Examples 5 and 6, an evaluation of light emission characteristics by CL measurements and an evaluation of electrical characteristics by Hall effect measurements were carried out. These evaluations were also made on the Example 11 thin film before subjected to laser irradiation. The results are summarized in Table 2.

TABLE 2

|  | CL emission peak wavelength (nm) | Resistivity ($\Omega$cm) | Carrier mobility (cm$^2$/V.S) | Carrier density (cm$^{-3}$) |
| --- | --- | --- | --- | --- |
| Example 11 before laser irradiation | no emission | beyond measuring range | below detection range | below detection range |
| Example 11 after laser irradiation | 380 | 1.3 | 10 | $-6.8 \times 10^{17}$ |
| Comparative Example 5 | no emission | beyond measuring range | below detection range | below detection range |
| Comparative Example 6 | no emission | beyond measuring range | below detection range | below detection range |

As seen from Table 2, with respect to the Example 11 thin film after subjected to laser irradiation, the peak of the CL emission spectrum was found at a wavelength of about 380 nm. Thus the Example 11 thin film after subjected to laser irradiation was found to have a property as a luminescent material. Further, the resistivity was 1.3 Ωcm, the carrier mobility was 10 $cm^2V^{-1}s^{-1}$, and the carrier density was $-6.8 \times 10^{17}$ $cm^{-3}$. It was thus confirmed that the Example 11 thin film after subjected to laser irradiation had n-type semiconductor characteristics. On the other hand, with respect to the Example 11 thin film before subjected to excimer laser irradiation, and the thin films of Comparative Examples 5 and 6, the resistivity, the carrier mobility and the carrier density were all beyond the measuring range. As understood from these results, excimer laser irradiation of a poly-crystalline GaN thin film which lacks semiconductor characteristics before subjected to irradiation causes the thin film to exhibit semiconductor characteristics, and some thin films become applicable to the manufacture of semiconductor light emitting devices such as an LED.

Example 12

In the present Example, a sapphire substrate with its crystal lattice c surface exposed was prepared. The dimensions of the sapphire substrate, i.e., length, width and height, were 20 mm, 20 mm and 1 mm, respectively. The sapphire substrate was cleaned with a neutral detergent, washed in water, and then subjected to ultrasonic cleaning with an organic solvent.

Then, the sapphire substrate thus washed was carried into an MOVPE system. The sapphire substrate was dry etched at the substrate temperature of 1050° C. while hydrogen was supplied into the system at the rate of 2 liters per minute at atmospheric pressure.

Then, the temperature of the sapphire substrate was set at 400° C. After that, hydrogen gas, ammonia gas and trimethylaluminum were introduced into the system at the rate of 20 liters per minute, 10 liters per minute, and $1.8 \times 10^{-5}$ mole per minute, respectively. Thus, a buffer layer comprised of single-crystal AlN having a thickness of 0.05 μm was deposited on the sapphire substrate.

Subsequently, the temperature of the sapphire substrate was set at 1000° C. After that, while the substrate temperature was maintained there, hydrogen gas, ammonia gas, trimethylgallium and silane gas diluted to 0.88 ppm with hydrogen gas were introduced into the system for 30 minutes at the rate of 20 liters per minute, 10 liters per minute, $1.8 \times 10^{-4}$ mole per minute, and 200 milliliters per minute, respectively. Thus, on the buffer layer, deposited was a single-crystal n-type GaN thin film having a film thickness of 2.2 μm and carrier density of $7.8 \times 10^{18}$ $cm^{-3}$.

The single-crystal n-type GaN thin film thus obtained was irradiated with a pulsed laser beam using a XeCl excimer laser provided inside the MOVPE system. The conditions of irradiation were the same as in Example 11.

Comparative Examples 7 and 8

Comparative Examples 7 and 8 were carried out with respect to Example 12. In Comparative Example 7, a single-crystal n-type GaN thin film was deposited and subjected to laser irradiation as in Example 12 except for the use of a He—Ne laser, instead of a XeCl excimer laser. In Comparative Example 8, a single-crystal n-type GaN thin film was deposited and subjected to ultraviolet irradiation as in Example 12 except for the use of a Hg—Xe ultraviolet lamp, instead of a XeCl excimer laser.

With respect to the thin films thus obtained in Example 12, and Comparative Examples 7 and 8, an evaluation of light emission characteristics by CL measurements and an evaluation of electrical characteristics by Hall effect measurements were carried out. These evaluations were also made on the Example 12 thin film before subjected to laser irradiation. The results are summarized in Table 3.

TABLE 3

| | CL emission peak wavelength (nm) | Relative light emission intensity ratio | Carrier mobility ($cm^2$/V.S) | Carrier density ($cm^{-3}$) |
|---|---|---|---|---|
| Example 12 before laser irradiation | 367 | 1.0 (reference) | 115 | $-7.8 \times 10^{18}$ |
| Example 12 after laser irradiation | 367 | 1.8 | 275 | $-1.8 \times 10^{18}$ |
| Comparative Example 7 | 367 | 1.0 | 115 | $-7.8 \times 10^{18}$ |
| Comparative Example 8 | 367 | 1.0 | 115 | $-7.8 \times 10^{18}$ |

As understood from Table 3, with respect to the Example 12 thin film before subjected to excimer laser irradiation, the Example 12 thin film after subjected to excimer laser irradiation, and the thin films of Comparative Examples 7 and 8, the peak of the CL emission spectrum was found at a wavelength of about 367 nm. Thus these thin films were found to have a property as a luminescent material. Especially, with respect to the Example 12 thin film after subjected to excimer laser irradiation, the light emission intensity was 1.8 times greater than before subjected to irradiation. A probable reason may be that excimer laser irradiation caused a reduction in lattice defects which occurred in the thin film and a reduction in energy traps which might serve as centers of non-radiative recombination due to lattice defects. Excimer laser irradiation also more than doubled the carrier mobility and reduced the carrier density to about one quarter. These results of an evaluation of electrical characteristics also suggested a reduction in lattice defects such as nitrogen deletion. It was thus confirmed that the thin film came to have excellent n-type semiconductor characteristics. As understood from these results, excimer laser irradiation of a single-crystal GaN thin film caused the thin film to exhibit excellent semiconductor characteristics, and some thin films become applicable to the manufacture of semiconductor light emitting devices such as an LED.

Although the invention has been described by referring to the embodiments and examples, the invention is not limited to the embodiments and examples but can be variously modified. For example, in the first embodiment above, a poly-crystalline Group III nitride compound semiconductor thin film was deposited by RF sputtering, but various sputtering methods can be also adopted. Examples include RF magnetron sputtering, focusing target sputtering, electron cyclotron resonance sputtering, DC (Direct Current) sputtering and DC magnetron sputtering.

The second embodiment above relates to the case of a single-crystal n-type GaN thin film, as an example of a deposition method of a single-crystal Group III nitride compound semiconductor. The invention, however, is also applicable to the deposition of other single-crystal Group III nitride compound semiconductors such as InN, BN, InGaN compound crystal, GaAlN compound crystal and InAlGaN compound crystal. The invention is also applicable to the case where p-type impurities such as magnesium are added. Indium can be derived from, for example, trimethylindium ($(CH_3)_3In$), and boron from, for example, triethylboron $((C_2H_5)_3B)$. When adding, for example, magnesium as p-type impurities, magnesium can be derived from bis=cyclopentadienyl magnesium $((C_2H_5)_2Mg)$.

The description given above with respect to the embodiments relates to a manufacturing method of a specific LED as an example of a semiconductor device. However, the invention is applicable with equal utility to the manufacture of an LED of other configurations. The invention has a broad range of applications including the manufacture of other semiconductor light emitting devices such as a laser diode, and the manufacture of semiconductor devices such as transistors except for semiconductor light emitting devices.

As described above, according to the deposition method of a Group III nitride compound semiconductor thin film, the Group III nitride compound semiconductor thin film, a manufacturing method of a semiconductor device or a semiconductor device of the invention, a poly-crystalline Group III nitride compound semiconductor thin film (poly-crystalline Group III nitride compound semiconductor layer) is deposited by sputtering. Thus, the thin film deposited becomes a thin film of uniform film thickness. Moreover, since the temperature at the time of deposition of a thin film can be lowered, it becomes unnecessary to use a substrate having high heat resistance, as distinct from the case where a thin film is deposited by epitaxial growth. This enables the use of any given substrate without limitation of material, shape and size of the substrate, and contributes to reduction in the manufacturing cost.

According to the deposition method of a Group III nitride compound semiconductor thin film of the invention, a Group III nitride compound semiconductor thin film is irradiated with a pulsed laser, and thereby lattice defects which occur in the thin film are removed. This enables an improvement in the crystalline of the Group III nitride compound semiconductor thin film.

Furthermore, the manufacturing method of a semiconductor device of the invention involves the use of the deposition method of a Group III nitride compound semiconductor thin film of the invention. This enables an improvement in the crystalline of the Group III nitride compound semiconductor thin film and enhancement of the performance of a semiconductor device.

Obviously many modifications and variations of the present invention are possible in the light of the above teachings. It is therefore to be understood that within the scope of the appended claims the invention may be practiced otherwise than as specifically described.

What is claimed is:

1. A deposition method of a Group III nitride compound semiconductor thin film, for depositing a Group III nitride compound semiconductor thin film comprising at least one Group III element and nitrogen (N),
    wherein a poly-crystalline Group III nitride compound semiconductor thin film is deposited on a substrate by sputtering using a target comprised of a Group III nitride compound in a plasma atmosphere of gas comprising at least nitrogen.

2. A deposition method of a Group III nitride compound semiconductor thin film as claimed in claim 1, wherein a Group III nitride compound semiconductor thin film is deposited at a deposition rate ranging from 15 nm/hour to 200 nm/hour, both inclusive.

3. A deposition method of a Group III nitride compound semiconductor thin film as claimed in claim 1, wherein a Group III nitride compound semiconductor thin film is deposited in a plasma atmosphere of gas comprising 10 mole % or more nitrogen (N).

4. A deposition method of a Group III nitride compound semiconductor thin film as claimed in claim 1, wherein the target is comprised of a Group III nitride compound comprising at least one element from the group consisting of aluminum (Al), gallium (Ga), indium (In) and boron (B).

5. A deposition method of a Group III nitride compound semiconductor thin film, the method comprising steps of:
    depositing, on a substrate, a poly-crystalline Group III nitride compound semiconductor thin film comprising at least one Group III element and nitrogen (N); and
    removing a lattice defect which occurs in the poly-crystalline Group III nitride compound semiconductor thin film, by irradiating the poly-crystalline Group III nitride compound semiconductor thin film deposited on the substrate with a pulsed laser.

6. A deposition method of a Group III nitride compound semiconductor thin film as claimed in claim 5, wherein irradiation with a pulsed laser is performed in an atmosphere of gas with an oxygen (O) content of 2 mole % or less.

7. A deposition method of a Group III nitride compound semiconductor thin film as claimed in claim 5, wherein the poly-crystalline Group III nitride compound semiconductor thin film is deposited by sputtering in a plasma atmosphere of gas comprising at least nitrogen.

8. A deposition method of a Group III nitride compound semiconductor thin film as claimed in claim 5, wherein the Group III element is at least one element from the group consisting of aluminum (Al), gallium (Ga), indium (In)and boron (B).

9. A deposition method of a Group III nitride compound semiconductor thin film, the method comprising steps of:
    depositing, on a substrate, a single-crystal Group III nitride compound semiconductor thin film comprising at least one Group III element and nitrogen (N); and
    removing a lattice defect which occurs in the single-crystal Group III nitride compound semiconductor thin film, by irradiating the single-crystal Group III nitride compound semiconductor thin film deposited on the substrate with a pulsed laser.

10. A deposition method of a Group III nitride compound semiconductor thin film as claimed in claim 9, wherein irradiation with a pulsed laser is performed in an atmosphere of gas with a nitrogen content of 95 mole % or more.

11. A deposition method of a Group III nitride compound semiconductor thin film as claimed in claim 9, wherein the Group III nitride compound semiconductor thin film is deposited by epitaxial growth.

12. A deposition method of a Group III nitride compound semiconductor thin film as claimed in claim 9, wherein the Group III element is at least one element from the group consisting of aluminum (Al), gallium (Ga), indium (In) and boron (B).

13. A manufacturing method of a semiconductor device comprising a Group III nitride compound semiconductor layer comprising at least one Group III element and nitrogen (N),
    wherein a poly-crystalline Group III nitride compound semiconductor layer is deposited on a substrate by sputtering using a target comprised of a Group III nitride compound in a plasma atmosphere of gas comprising at least nitrogen.

14. A manufacturing method of a semiconductor device comprisirg a Group III nitride compound semiconductor layer comprising at least one Group III element and nitrogen (N), the method comprising steps of:
    depositing, on a substrate, a poly-crystalline Group III nitride compound semiconductor layer comprising at least one Group III element and nitrogen; and removing a lattice defect which occurs in the poly-crystalline Group III nitride compound semiconductor layer, by irradiating the poly-crystalline Group III nitride compound semiconductor layer deposited on the substrate with a pulsed laser.

15. A manufacturing method of a semiconductor device comprising a Group III nitride compound semiconductor layer comprising at least one Group III element and nitrogen (N), the method comprising steps of depositing, on a substrate, a single-crystal Group III nitride compound semiconductor layer comprising at least one Group III element and nitrogen; and removing a lattice defect which occurs in the single-crystal Group III nitride compound semiconductor layer, by irradiating the single-crystal Group III nitride compound semiconductor layer deposited on the substrate with a pulsed laser.

* * * * *